United States Patent [19]
Ngo

[11] Patent Number: 5,736,423
[45] Date of Patent: Apr. 7, 1998

[54] METHOD FOR DEPOSITING VERY THIN PECVD $SIO_2$ IN 0.5 MICRON AND 0.35 MICRON TECHNOLOGIES

[75] Inventor: Minh Van Ngo, Union City, Calif.

[73] Assignee: Advanced Micro Devices, Inc., Sunnyvale, Calif.

[21] Appl. No.: 558,367

[22] Filed: Nov. 16, 1995

[51] Int. Cl.$^6$ ............................ H01L 21/02; H01L 21/77
[52] U.S. Cl. ................ 437/238; 437/235; 427/578; 427/579
[58] Field of Search .................. 427/574, 573, 427/578, 579, 255.3, 235, 238

[56] References Cited

U.S. PATENT DOCUMENTS

| | | | |
|---|---|---|---|
| 4,527,007 | 7/1985 | Fuse | 136/256 |
| 4,681,653 | 7/1987 | Purdes et al. | 156/614 |
| 4,877,641 | 10/1989 | Dory | 427/38 |
| 5,040,046 | 8/1991 | Chhabra et al. | |
| 5,264,712 | 11/1993 | Murata et al. | 257/71 |
| 5,284,789 | 2/1994 | Mori et al. | 437/113 |
| 5,362,526 | 11/1994 | Wang et al. | 427/573 |

FOREIGN PATENT DOCUMENTS

| | | |
|---|---|---|
| 0522799 A2 | 1/1993 | European Pat. Off. |
| 0596551 A1 | 5/1994 | European Pat. Off. |

*Primary Examiner*—Nam Nguyen
*Assistant Examiner*—Luz Alejandro
*Attorney, Agent, or Firm*—Skjerven, Morrill, MacPherson, Franklin & Friel LLP; Ken J. Koestner

[57] ABSTRACT

A very thin (less than 350 angstrom) layer of silicon dioxide ($SiO_2$) is produced using plasma-enhanced chemical vapor deposition (PECVD) by substantially increasing the time duration of pre-coat and soak time steps of the PECVD process and substantially reducing the flow of silane ($SiH_4$), the applied high frequency power and the applied pressure in the PECVD process.

21 Claims, 2 Drawing Sheets

- Wafer Temperature Soak Time = 18.5 Secs
- Precoat Time (Chamber Seasoning) = 300 Secs The Above Set-ups are Important to Prevent the Thin PECVD SiO2 from Haze and Porous Condition Which is Very Poor Thin Film Properties.

METHOD FOR DEPOSITING VERY THIN PECVD SIO₂ IN 0.5 MICRON AND 0.35 MICRON TECHNOLOGIES

FIELD OF THE INVENTION

This invention relates to the field of integrated circuit fabrication methods and, more specifically, to integrated circuit fabrication methods for depositing a very thin layer of silicon dioxide ($SiO_2$).

BACKGROUND OF THE INVENTION

Various integrated circuits utilize structures formed by a thin layer of silicon dioxide ($SiO_2$) for various purposes. For example, a thin layer of $SiO_2$ is used as a protection structure for on-chip resistors. As integrated circuit technologies become smaller, it is advantageous for all structures to become smaller, including thin $SiO_2$ layers.

Suitably thin $SiO_2$ layers can be formed using a conventional method of thermal oxide deposition. However, the high thermal budget associated with thermal oxide consumes silicon and drives source/drain (S/D) implantation further so that the S/D implant is not easily controlled.

An advantageous alternative to thermal oxide deposition of a thin $SiO_2$ layer is deposition using plasma-enhanced chemical vapor deposition (PECVD) technique. However, conventional PECVD methods do not allow deposition of layers less than about 1000 angstroms.

What is needed is a fabrication method that repeatably produces a high quality, uniform and very thin PECVD $SiO_2$ layer.

SUMMARY OF THE INVENTION

In accordance with the present invention, a very thin (less than 350 angstrom) layer of silicon dioxide ($SiO_2$) is produced using plasma-enhanced chemical vapor deposition (PECVD) by substantially increasing the time duration of pre-coat and soak time steps of the PECVD process and substantially reducing the flow of silane ($SiH_4$), the applied high frequency power and the applied pressure in the PECVD process.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 1:
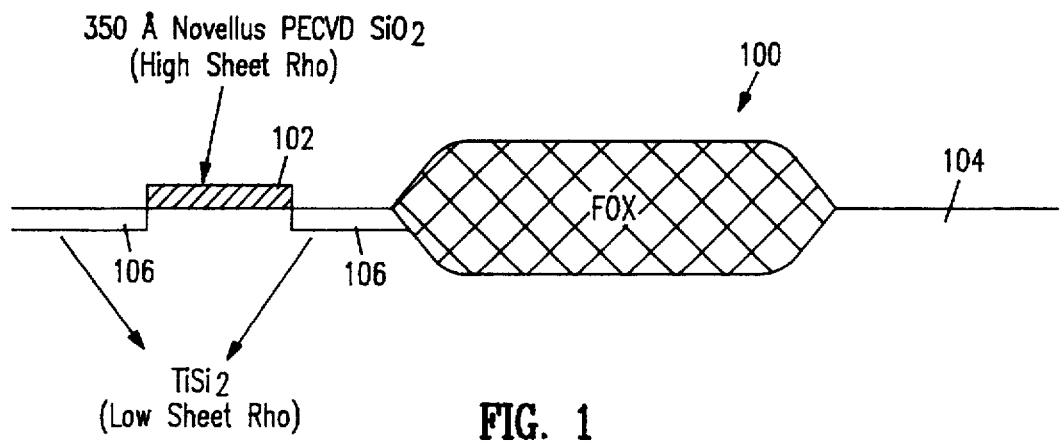
FIG. 1 is a cross-sectional view of an integrated circuit wafer showing an example of a thin PECVD $SiO_2$ layer deposited for resistor protection.

Referring to FIG. 1, a cross-sectional view of an integrated circuit wafer 100 shows an example of a thin PECVD $SiO_2$ layer 102 for a resistor protection deposition. The PECVD $SiO_2$ layer 102 overlies a silicon substrate 104. Titanium silicide ($TiSi_2$) 106 is deposited after the PECVD $SiO_2$ layer 102 is formed on the silicon substrate 104 by conventional salicide process techniques so that the silicon substrate 104 underlying the PECVD $SiO_2$ layer 102 is blocked and therefore not affected by the salicide process. In this manner, an in-chip resistor is formed. The PECVD $SiO_2$ layer 102 produced using a method illustrated in FIGS. 2 and 3 forms a PECVD $SiO_2$ layer 102 of about 350 angstroms or smaller.

Figure 2:
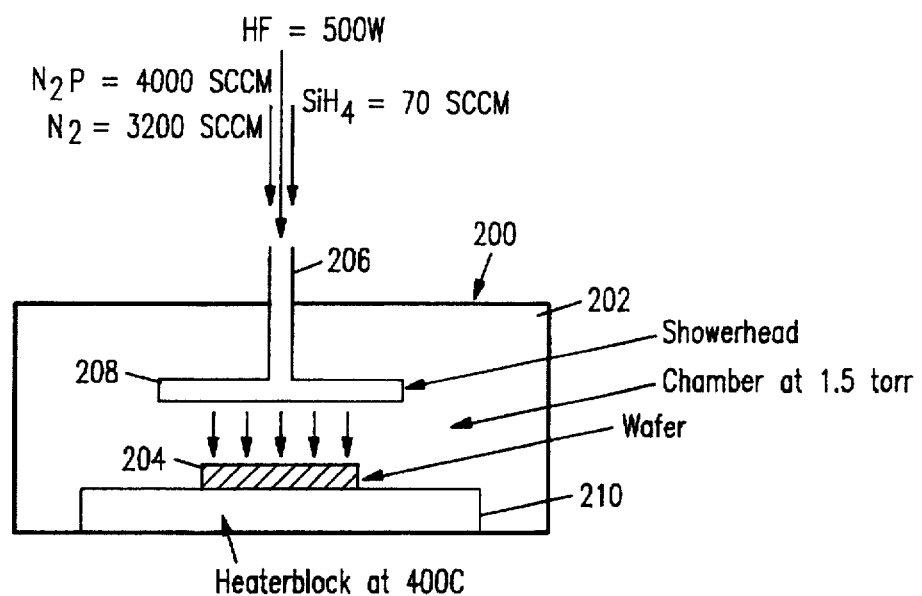
FIG. 2 is a pictorial representation of a method for depositing a thin $SiO_2$ layer in accordance with one embodiment of the present invention.

Referring to FIG. 2, a PECVD reactor 200 for depositing a thin $SiO_2$ layer of 350 angstroms or smaller is shown. In one embodiment of the method, a NOVELLUS CONCEPT 1 (TM) PECVD reactor 200 is used to deposit $SiO_2$ in a silane ($SiH_4$)-based system. For processing 8" (approximately 200 mm) semiconductor wafers, a 200 mm system having 5 shower heads for applying reactant gases deposits the 350 angstrom $SiO_2$ layer so that about 70 angstroms per shower head are applied. For processing 6" (approximately 150 mm) semiconductor wafers, a 150 mm system having 7 shower heads for applying reactant gases deposits the 350 angstrom $SiO_2$ layer so that about 50 angstroms per shower head are applied. In these embodiments, reactant gases include silane ($SiH_4$), nitrous oxide ($N_2O$) and molecular nitrogen ($N_2$).

The reactor 200 includes a chamber 202 holding a wafer 204, an in-flow tube 206 for carrying reactant gases to the chamber 202, a shower head 208 for applying the reactant gases to the chamber 202. A heater block 210 heats the wafer 204 and also supports the wafer 204 during processing.

To deposit thin $SiO_2$ in accordance with an embodiment of the present invention the flow of silane $SiH_4$ is substantially reduced, the RF power applied to the reactor 200 is substantially reduced and the pressure applied to the reactor 200 is substantially reduced.

Figure 3:
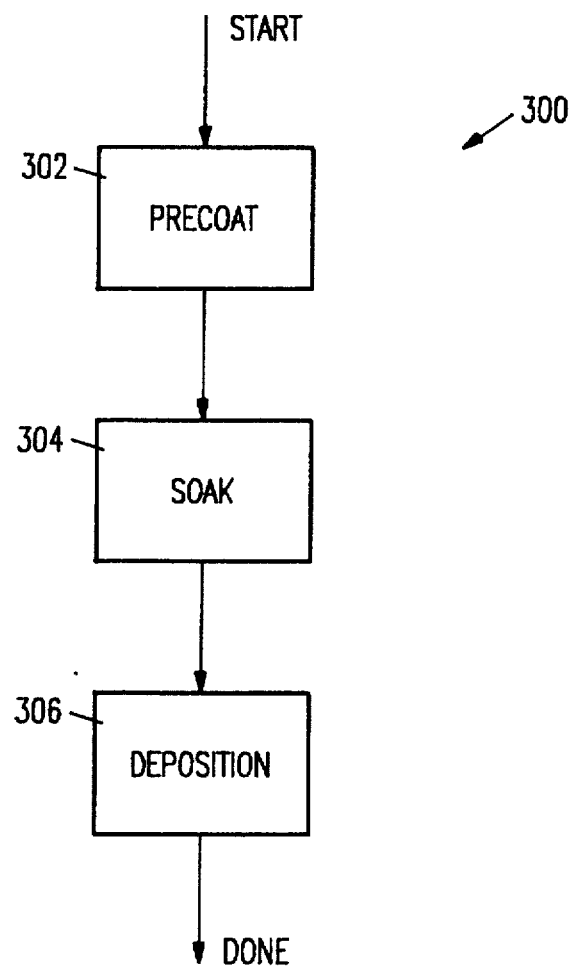
FIG. 3 is a flow chart which illustrates steps of a method for depositing a thin $SiO_2$ layer in accordance with the present invention.

Referring to FIG. 3, a flow chart illustrates steps of a method 300 for depositing a thin $SiO_2$ layer. A precoat time, as is known in the PECVD art, is employed for chamber seasoning in precoat step 302. During a precoat operation, the wafer 204 is held outside the reactor 200 while reactant gases are applied to the chamber 202. The precoat step 302 coats the interior surfaces of the reactor 200. In precoat step 302, a precoat time that is substantially longer than a precoat time for a conventional PECVD technique is utilized. For example, a standard precoat time using the NOVELLUS CONCEPT 1 (TM) PECVD reactor is approximately 60 seconds. The precoat time for an embodiment of the inventive method is substantially increased to about 300 seconds, although increases to 285 seconds or more are suitable. During, the increased-duration precoat step 302, the RF plasma is activated sufficiently long for deposition repeatability and production of a denser film.

A wafer temperature soak operation, as is known in the PECVD art, is applied in soak step 304. During the soak operation, a cold wafer 204 from outside the reactor 200 is placed into the chamber 202 and heated on the heaterblock 210 before reactant gases, power and pressure are applied to the chamber 202. In a soak step 302, a soak time that is substantially longer than a soak time for a conventional PECVD technique is utilized. For example, a standard soak time using the NOVELLUS CONCEPT 1 (TM) PECVD reactor is approximately 9 seconds. The soak time for an embodiment of the inventive method is substantially increased to about 18.5 seconds, although increases to 17 seconds or more are suitable.

The wafer temperature soak time and precoat time are increased to prevent the thin PECVD $SiO_2$ layer from showing a haze appearance and a porous condition. Such an appearance and condition are indicative of very poor thin film properties.

In deposition step 306, the reactants including silane (Si₄), nitrous oxide (N₂O) and molecular nitrogen (N₂) are applied by a flow into the chamber 202 at a selected pressure and RF power. In a deposition step 306, deposition parameters that are substantially different from the deposition parameters for a conventional PECVD technique are utilized.

For example, standard deposition parameters using the NOVELLUS CONCEPT 1 (TM) PECVD reactor to fabricate 6" (150 mm) wafers include reactant gas flow rates of 200 sccm for silane (SiH₄), 6000 sccm for nitrous oxide (N₂O) and 3150 sccm for nitrogen (N₂). Conventionally, RF power is applied at 1000 watts at a pressure of 1.5 torr. The deposition temperature is 400 degrees Celsius. Using these deposition parameters, a deposition rate of 5500 angstroms per minute is achieved.

In an embodiment of the present invention using the NOVELLUS CONCEPT 1 (TM) PECVD reactor to fabricate 6" (150 mm) wafers, the silane (SiH₄) flow rate is reduced to about 70 sccm, although flow rates from 65 sccm to 75 sccm are suitable. The nitrous oxide (N₂O) flow rate is reduced to about 4000 sccm, although flow rates from 3900 sccm to 4100 sccm are suitable. Nitrogen flow rates from 3100 sccm to 3300 sccm are suitable and do not differ from the nitrogen flow rates of the conventional process. RF power is reduced to about 500 watts although power in a range from 480 watts to 520 watts is suitable. Pressure is applied at about 1.5 torr although pressures from 1.4 torr to 1.6 torr are suitable. The deposition temperature is 400 degrees Celsius and substantially unchanged from the conventional process. Using these deposition parameters, a deposition rate is lowered to about 1700 angstroms per minute. Deposition is applied for about 2.4 seconds.

In another example, standard deposition parameters using the NOVELLUS CONCEPT 1 (TM) PECVD reactor to fabricate 8"(200 mm) wafers include reactant gas flow rates of 300 sccm for silane (SiH₄), 9500 sccm for nitrous oxide (N₂O) and 1500 sccm for nitrogen (N₂). Conventionally, RF power is applied at 1100 watts at a pressure of 2.4 torr. The deposition temperature is 400 degrees Celsius. Using these deposition parameters, a deposition rate of 5400 angstroms per minute is achieved.

In an embodiment of the present invention using the NOVELLUS CONCEPT 1 (TM) PECVD reactor to fabricate 8" (200 mm) wafers, the silane (SiH₄) flow rate is reduced to about 100 sccm, although flow rates from 95 sccm to 105 sccm are suitable. The nitrous oxide (N₂O) flow rate is reduced to about 6500 sccm, although flow rates from 6400 sccm to 6600 sccm are suitable. Nitrogen flow rates from 2000 sccm to 2200 sccm are suitable and do not differ from the nitrogen flow rates of the conventional process. RF power is reduced to about 500 watts although power in a range from 480 watts to 520 watts is suitable. Pressure is applied at about 1.6 torr although pressures from 1.5 torr to 1.7 torr are suitable. The deposition temperature is 400 degrees Celsius and substantially unchanged from the conventional process. Using these deposition parameters, a deposition rate is lowered to about 1700 angstroms per minute. Deposition is applied for about 2.4 seconds.

Thin film properties are substantially improved using the disclosed method with the SiO₂ improving in silicon richness as is shown by a refractor 4 index (RI) that improves from 1.465 using the conventional method to an RI of 1.476 for 8" wafers and to an RI of 1.480 for 6" wafers. Similarly, the disclosed process improves density of the SiO₂ film as is shown by an improvement in wet etch rate from 338 angstroms per minute using the conventional process to a wet etch rate of 245 angstroms per minute for 8" wafers and to a wet etch rate of 242 angstroms per minute for 6" wafers. Similarly, uniformity is substantially improved using the disclosed method. Same-wafer variability in thickness of 2.37 angstroms and a wafer to wafer variability of 2.58 angstroms are measured using the conventional process. In the disclosed method for 8" wafers, same-wafer variability in thickness is improved to 0.45 angstroms and a wafer to wafer variability is improved to 0.8 angstroms. In the disclosed method for 6" wafers, same-wafer variability in thickness is improved to 0.51 angstroms and a wafer to wafer variability is improved to 1.0 angstroms.

The description of certain embodiments of this invention is intended to be illustrative and not limiting. Numerous other embodiments will be apparent to those skilled in the art, all of which are included within the broad scope of this invention. For example, A thin layer of silicon is grown by PECVD SiO₂ deposition using Silane (SiH₄) as the silicon source. In other embodiments of the fabrication method, other sources of silicon may be employed, including silicon tetrachloride (SICl₄), trichlorosilane (SiHCl₃) or dichlorosilane (SiH₂Cl₂). Silane and dichorosilane are typically used for depositing relatively thin silicon epitaxial layers and for depositing epitaxial layers at a relatively low temperature.

What is claimed is:

1. A method of depositing a thin PECVD SiO₂ layer using a PECVD reactor comprising the steps of:

precoating the PECVD reactor for a minimum time duration of 285 seconds;

wafer temperature soaking a semiconductor wafer for a minimum time duration of 17 seconds; and applying reactant gases to the wafer under pressure in a range from 1.4 torr to 1.7 torr and RF power in a range from 480 watts to 520 watts, the reactant gases including:

silane (SiH₄) at a flow rate in a range from 65 sccm to 105 sccm;

nitrous oxide (N₂O) at a flow rate in a range from 3900 sccm to 6600 sccm, and nitrogen (N₂) at a flow rate in a range from 2000 sccm to 3300 sccm.

2. A method according to claim 1 wherein: the wafer is a 6" wafer;

reactant gases are applied to the wafer under pressure in a range from 1.4 torr to 1.6 torr and RF power in a range from 480 watts to 520 watts, the reactant gases including:

silane (SiH₄) at a flow rate in a range from 65 sccm to 75 sccm;

nitrous oxide (N₂O) at a flow rate in a range from 3900 sccm to 4100 sccm, and nitrogen (N₂) at a flow rate in a range from 3100 sccm to 3300 sccm.

3. A method according to claim 2 wherein:

reactant gases are applied to the wafer under pressure of approximately 1.5 torr and RF power of approximately 500 watts, the reactant gases including:

silane (SiH₄) at a flow rate of approximately 70 sccm;

nitrous oxide (N₂O) at a flow rate of approximately 4000 sccm; and nitrogen (N₂) at a flow rate of approximately 3200 sccm.

4. A method according to claim 1 wherein:

the wafer is a 8" wafer;

reactant gases are applied to the wafer under pressure in a range from 1.6 torr to 1.7 torr and RF power in a range from 480 watts to 520 watts, the reactant gases including:

silane (SiH$_4$) at a flow rate in a range from 95 sccm to 105 sccm;

nitrous oxide (N$_2$O) at a flow rate in a range from 6400 sccm to 6600 sccm, and nitrogen (N$_2$) at a flow rate in a range from 2000 sccm to 2200 sccm.

5. A method according to claim 4 wherein:

reactant gases are applied to the wafer under pressure of approximately 1.6 torr and RF power of approximately 500 watts, the reactant gases including:

silane (SiH$_4$) at a flow rate of approximately 100 sccm;

nitrous oxide (N$_2$O) at a flow rate of approximately 6500 sccm; and nitrogen (N$_2$) at a flow rate of approximately 2100 sccm.

6. A method of depositing a thin PECVD SiO$_2$ layer using a PECVD reactor comprising the steps of:

precoating the PECVD reactor for a time duration greater than or equal to 285 seconds;

wafer temperature soaking a semiconductor wafer for a time duration greater than or equal to 17 seconds; and applying reactant gases to the semiconductor wafer under pressure in a range from 1.4 torr to 1.7 torr and RF power in a range from 480 watts to 520 watts, the reactant gases including:

a silicon source reactant gas at a flow rate in a range from 65 sccm to 105 sccm;

nitrous oxide (N$_2$O) at a flow rate in a range from 3900 sccm to 6600 sccm, and nitrogen (N$_2$) at a flow rate in a range from 2000 sccm to 3300 sccm.

7. A method according to claim 6 wherein the silicon source reactant gas is selected from silicon tetrachloride (SiCl$_4$), trichlorosilane (SiHCl$_3$), and dichlorosilane (SiH$_2$Cl$_2$).

8. A method according to claim 6 wherein:

the wafer is a 6" wafer;

reactant gases are applied to the wafer under pressure in a range from 1.4 torr to 1.6 torr and RF power in a range from 480 watts to 520 watts, the reactant gases including:

the silicon source reactant gas at a flow rate in a range from 65 sccm to 75 sccm;

nitrous oxide (N$_2$O) at a flow rate in a range from 3900 sccm to 4100 sccm, and nitrogen (N$_2$) at a flow rate in a range from 3100 sccm to 3300 sccm.

9. A method according to claim 8 wherein the silicon source reactant gas is selected from silicon tetrachloride (SiCl$_4$), trichlorosilane (SiHl$_3$), and dichlorosilane (SiH$_2$Cl$_2$).

10. A method according to claim 9 wherein:

reactant gases are applied to the wafer under pressure of approximately 1.5 torr and RF power of approximately 500 watts, the reactant gases including:

the silicon source reactant gas at a flow rate of approximately 70 sccm;

nitrous oxide (N$_2$O) at a flow rate of approximately 4000 sccm; and nitrogen (N$_2$) at a flow rate of approximately 3200 sccm.

11. A method according to claim 6 wherein:

the wafer is a 8" wafer;

reactant gases are applied to the wafer under pressure in a range from 1.6 torr to 1.7 torr and RF power in a range from 480 watts to 520 watts, the reactant gases including:

the silicon source reactant gas at a flow rate in a range from 95 sccm to 105 sccm;

nitrous oxide (N$_2$O) at a flow rate in a range from 6400 sccm to 6600 sccm, and nitrogen (N$_2$) at a flow rate in a range from 2000 sccm to 2200 sccm.

12. A method according to claim 11 wherein the silicon source reactant gas is selected from silicon tetrachloride (SiCl$_4$), trichlorosilane (SiHCl$_3$), and dichlorosilane (SiH$_2$Cl$_2$).

13. A method according to claim 12 wherein:

reactant gases are applied to the wafer under pressure of approximately 1.6 torr and RF power of approximately 500 watts, the reactant gases including:

the silicon source reactant gas at a flow rate of approximately 100 sccm;

nitrous oxide (N$_2$O) at a flow rate of approximately 6500 sccm; and nitrogen (N$_2$) at a flow rate of approximately 2100 sccm.

14. A method of fabricating an integrated circuit comprising the steps of:

depositing a thin PECVD SiO$_2$ layer using a PECVD reactor;

precoating the PECVD reactor for a time duration of 285 or more seconds;

wafer temperature soaking a semiconductor wafer for a time duration of 17 or more seconds; and applying reactant gases to the semiconductor wafer under pressure in a range from 1.4 torr to 1.7 torr and RF power in a range from 480 watts to 520 watts, the reactant gases including:

a silicon source reactant gas at a flow rate in a range from 65 sccm to 105 sccm;

nitrous oxide (N$_2$O) at a flow rate in a range from 3900 sccm to 6600 sccm, and nitrogen (N$_2$) at a flow rate in a range from 2000 sccm to 3300 sccm.

15. A method according to claim 14 wherein the silicon source reactant gas is selected from silicon tetrachloride (SiCl$_4$), trichlorosilane (SiHCl$_3$), and dichlorosilane (SiH$_2$Cl$_2$).

16. A method according to claim 14 wherein:

the wafer is a 6" wafer;

reactant gases are applied to the wafer under pressure in a range from 1.4 torr to 1.6 torr and RF power in a range from 480 watts to 520 watts, the reactant gases including:

the silicon source reactant gas at a flow rate in a range from 65 sccm to 75 sccm;

nitrous oxide (N$_2$O) at a flow rate in a range from 3900 sccm to 4100 sccm, and nitrogen (N$_2$) at a flow rate in a range from 3100 sccm to 3300 sccm.

17. A method according to claim 16 wherein the silicon source reactant gas is selected from silicon tetrachloride (SiCl$_4$), trichlorosilane (SiHCl$_3$), and dichlorosilane (SiH$_2$Cl$_2$).

18. A method according to claim 17 wherein:

reactant gases are applied to the wafer under pressure of approximately 1.5 torr and RF power of approximately 500 watts, the reactant gases including:

the silicon source reactant gas at a flow rate of approximately 70 sccm;

nitrous oxide (N$_2$O) at a flow rate of approximately 4000 sccm; and nitrogen (N$_2$) at a flow rate of approximately 3200 sccm.

19. A method according to claim 14 wherein:

the wafer is a 8" wafer;

reactant gases are applied to the wafer under pressure in a range from 1.6 torr to 1.7 torr and RF power in a range from 480 watts to 520 watts, the reactant gases including:

the silicon source reactant gas at a flow rate in a range from 95 sccm to 105 sccm;

nitrous oxide ($N_2O$) at a flow rate in a range from 6400 sccm to 6600 sccm, and nitrogen ($N_2$) at a flow rate in a range from 2000 sccm to 2200 sccm.

20. A method according to claim 19 wherein the silicon source reactant gas is selected from silicon tetrachloride ($SICl_4$), trichlorosilane ($SiHCl_3$), and dichlorosilane ($SiH_2Cl_2$).

21. A method according to claim 20 wherein:

reactant gases are applied to the wafer under pressure of approximately 1.6 torr and RF power of approximately 500 watts, the reactant gases including:

the silicon source reactant gas at a flow rate of approximately 100 sccm;

nitrous oxide ($N_2O$) at a flow rate of approximately 6500 sccm; and nitrogen ($N_2$) at a flow rate of approximately 2100 sccm.

* * * * *

UNITED STATES PATENT AND TRADEMARK OFFICE
CERTIFICATE OF CORRECTION

PATENT NO. : 5,736,423
DATED : April 7, 1998
INVENTOR(S) : Ngo, Minh Van

It is certified that error appears in the above-identified patent and that said Letters Patent is hereby corrected as shown below:

Column 5, line 49, delete "$(SiHl_3)$" and insert --$(SiHCl_3)$--.

Column 3, line 1, delete "$(Si_4)$" and insert --$(SiH_4)$--.

Column 3, line 61, delete "refractor 4" and insert --refractory--.

Column 4, line 21, delete "$(SICl_4)$" and insert --$(SiCl_4)$--.

Signed and Sealed this

Sixth Day of October, 1998

Attest:

BRUCE LEHMAN

Attesting Officer

Commissioner of Patents and Trademarks